(12) United States Patent
Nakayama et al.

(10) Patent No.: US 9,320,150 B2
(45) Date of Patent: Apr. 19, 2016

(54) DISPLAY APPARATUS

(71) Applicant: Sharp Kabushiki Kaisha, Osaka (JP)

(72) Inventors: Masaki Nakayama, Osaka (JP); Motoji Shiota, Osaka (JP); Takashi Matsui, Osaka (JP); Hiroki Miyazaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 147 days.

(21) Appl. No.: 14/376,755

(22) PCT Filed: Jan. 31, 2013

(86) PCT No.: PCT/JP2013/000545
§ 371 (c)(1),
(2) Date: Aug. 5, 2014

(87) PCT Pub. No.: WO2013/118475
PCT Pub. Date: Aug. 15, 2013

(65) Prior Publication Data
US 2015/0029436 A1    Jan. 29, 2015

(30) Foreign Application Priority Data
Feb. 7, 2012  (JP) .................................. 2012-024043

(51) Int. Cl.
*G02F 1/1333* (2006.01)
*H05K 1/18* (2006.01)
*G02F 1/1345* (2006.01)
*G02F 1/1339* (2006.01)
*H05K 1/14* (2006.01)

(52) U.S. Cl.
CPC .............. *H05K 1/189* (2013.01); *G02F 1/1339* (2013.01); *G02F 1/13452* (2013.01); *H05K 1/142* (2013.01); *G02F 1/133308* (2013.01); *G02F 2001/13456* (2013.01); *G02F 2001/133314* (2013.01); *G02F 2202/28* (2013.01); *H05K 2201/10136* (2013.01)

(58) Field of Classification Search
CPC ............ G02F 1/133308; G02F 1/1345; G02F 1/1335; G02F 1/13452; G02F 1/13454; G02F 1/133608; G02F 1/133305; G02F 1/133615; G02F 1/13458; G02F 1/1333; G02F 1/13; G02F 1/133524; G02F 2202/28; G02F 2001/133317; G02F 2001/133314; G02F 2001/133322; G02F 2001/133388; G02F 2001/13456; H05K 5/0017; H05K 5/0217; H05K 5/03; H05K 13/00; H05K 1/189; H05K 1/118; H05K 1/147; H05K 1/142; H05K 2201/10128; H05K 2201/10136; H05K 2201/055; H05K 2201/10681; H05K 7/1427; H05K 9/0054; G06F 1/16; G06F 1/1601; G06F 1/1637; G06F 1/1641
USPC ............. 349/58, 65, 158, 150, 151, 152, 122; 361/749, 752, 748, 679.27, 760, 767, 361/707; 362/97.1, 612, 633, 382, 97.2, 362/97.4, 631, 632, 634; 348/836, 794; 156/249, 60, 248
See application file for complete search history.

(56) References Cited

U.S. PATENT DOCUMENTS

2007/0200963 A1* 8/2007 Shin .................. H04N 5/645
                                                  348/836
2011/0187965 A1    8/2011 Ooishi

FOREIGN PATENT DOCUMENTS

JP        2011-158754 A     8/2011

*Primary Examiner* — Thoi Duong
(74) *Attorney, Agent, or Firm* — Chen Yoshimura LLP

(57) ABSTRACT

A display apparatus is provided with: a frame; a display panel, which is fixed to the frame; and a plurality of flexible printed circuit boards, which are disposed adjacent to each other, and each of which has one end side pressure bonded to the display panel, and the other end side bent to the frame side, which is the reverse side of the display panel. The display apparatus has adhesive areas wherein a surface of the display panel is adhered and fixed to the frame, the adhesive areas being in areas overlapping the flexible printed circuit boards. In regions among the flexible printed circuit boards adjacent to each other, non-adhesive areas where the surface of the display panel is not adhered and fixed to the frame are provided.

13 Claims, 14 Drawing Sheets

DISPLAY APPARATUS

TECHNICAL FIELD

The present invention relates to a display device with a flexible printed circuit board.

BACKGROUND ART

Recently, demand for flat panel displays (FPD) for liquid crystal display devices and the like, for example, has increased. A liquid crystal display device has a liquid crystal display panel in a rectangular plate shape and a backlight module as an illumination device disposed at the rear side of the liquid crystal display panel, for example (refer to Patent Document 1 and the like, for example).

The liquid crystal display panel has a rectangular plate shaped non-display area that is formed along the four peripheral sides of the panel. One side of the non-display area is a terminal region with a wide frame width. At the terminal region, a plurality of terminals are formed where one end portion of the flexible printed circuit board (FPC) is attached.

The backlight module has a rectangular plate shaped frame having a light guide plate and the like disposed on the inner side thereof. Furthermore, a liquid crystal display panel is attached and fixed to the frame of the backlight module with a double-sided tape.

In order to bond a wider area of the liquid crystal display panel and the frame, the double-sided tape is disposed on a relatively large area of the terminal region, and is provided so as to cover one whole side of the terminal region of the non-display area.

An FPC with an edge attached to the terminal region is bent at a side of the backlight module. Another end of the FPC is bonded to the rear surface of the backlight module with a double-sided tape and the like. When the FPC is bent in this manner, internal stress is generated in the region that is folded, and a restoring force is generated on the folded portion. Thus, there is a problem in which a portion of the liquid crystal display panel rises due to this restoring force of the FPC.

With a liquid crystal display device disclosed in Patent Document 1 an attempt is made to prevent the rising of the liquid crystal display panel by fixing the FPC to the frame using pins and adhesive materials. However, in the liquid crystal display device in Patent Document 1, due to one wide FPC being attached to the terminal region, the restoring force of the FPC becomes relatively large, making it difficult to prevent the rising of the liquid crystal display panel.

A known countermeasure is to divide the FPC into multiple FPCs and provide them on the terminal region. By providing a plurality of relatively narrow FPCs, it is possible to reduce the restoring force generated by each FPC. Furthermore, the manufacturing cost of the FPC can be reduced as the number of cuts of the FPC from the base material can be increased when manufacturing the FPC.

RELATED ART DOCUMENTS

Patent Documents

Patent Document 1: Japanese Patent Application Laid-Open Publication No. 2011-158754

SUMMARY OF THE INVENTION

Problems to be Solved by the Invention

However, the liquid crystal display device of Patent Document 1 has a problem in which a plurality of pins and adhesive materials are needed to fix each FPC onto a frame, which significantly increases the number of components and thus requires additional effort in manufacturing.

Furthermore, when a plurality of regions of the display panel where a FPC is attached to rise due to the restoring force of each FPC, since the region in which the FPC is not attached is adhesively held by double-sided tape, the display panel deforms into a wave-shape at the terminal region where this FPC is provided, resulting in uneven display. Recently, the problem is more pronounced as display panels have lower rigidity due to becoming very thin.

The present invention was made in view of the above points, and aims at improving display quality while suppressing the increase in the number of components for a display device provided with a plurality of flexible printed circuit boards.

Means for Solving the Problems

To achieve the above-mentioned aims, in the present invention, the display panel is bonded to the chassis (frame) in select areas, which correspond to where the respective flexible printed circuit boards and the display panel overlap in a plan view, and the surface of the display panel and the frame are not bonded in areas between the adjacent flexible printed circuit boards.

Specifically, the display device related to the first invention includes a chassis; a display panel fixed to a front of the chassis; and a plurality of flexible printed circuit boards that are arranged adjacent to each other with a gap therebetween along a side of the chassis, one end of each flexible printed circuit board being attached to the display panel, each flexible printed circuit board being bent such that another end of the flexible printed circuit board is on a rear of the chassis and, wherein the display panel is bonded to the chassis in select areas (adhesive areas), which correspond to overlaps between the respective flexible printed circuit boards and the display panel in a plan view, and wherein the display panel is not physically bonded to the chassis in an area (non-adhesive area) other than the select areas along the side of the chassis, where the flexible printed circuit board does not overlap the display in the plan view.

According to this invention, the restoring force of the bent flexible printed circuit board at the display panel causes stress in a direction that raises the frame in the adhesive areas. Meanwhile, in the non-adhesive area, the display panel and the frame are not bonded, and thus the concentration of stress near the border of the adhesive areas and non-adhesive area can be suppressed. Thus, in the display device provided with a plurality of flexible printed circuit boards, the display quality of the display device can be improved by ensuring that the display panel does not deform into a wave-shape, while suppressing an increase in the number of components used.

The second invention is the display device according to the first invention, wherein the display panel and the chassis are bonded by interposing an adhesive member between the chassis and the display panel, the adhesive member having an adhesive portion on a front surface of the adhesive member facing the display panel in the select areas, and having a non-adhesive portion on a front surface of the adhesive member facing the display panel in the area other than the select area along the side of the chassis with the flexible printed circuit boards.

According to this invention, the adhesive member is provided in the adhesive area and the non-adhesive area, making it harder for foreign matter to penetrate between the display panel and the frame from outside, resulting in a more reliable display device. Furthermore, by providing one adhesive member for the plurality of select areas, the manufacturing procedure is simplified compared to providing individual adhesive members to each adhesive area.

The third invention is the display device according to the first invention, wherein the display panel and the chassis are bonded by interposing a plurality of island-shaped adhesive members between the chassis and the display panel, the adhesive members being provided in the select areas, each of the adhesive members having an adhesive portion formed on an entire front surface of each adhesive member facing the display panel.

According to this invention, while the display panel and the frame are bonded in the adhesive areas by the adhesive member, since no adhesive member is provided in the non-adhesive area, the liquid crystal display panel and the frame are not bonded in the non-adhesive area.

In the fourth invention, the display device according to the third invention further includes: a shielding part that covers a gap between the adhesive members formed between the chassis and the display panel.

According to this invention, because the gaps between the adhesive members adjacent to each other are covered by the shielding part, it is harder for foreign matter to enter between the display panel and the frame from outside, resulting in a more reliable display device.

The fifth invention is the fourth invention, wherein the shielding part is a spacer formed separately from the chassis.

According to this invention the spacer can be formed of other suitable materials that are different from the materials used for the frame, the adhesive member, and the like.

The sixth invention is the display device according to the third invention, wherein the chassis has a shielding part that fills an entire area between the adhesive members.

According to this invention, since the shielding part can be made with the frame which is a material used to form the backlight module, the increase in the number of components from forming a shielding part can also be suppressed.

The seventh invention is the display device according to the first invention, wherein the chassis includes protruding portions protruding towards the display panel in the select areas, and a recessed portion formed between the protruding portions, and wherein the display device further comprises an adhesive member that covers the protruding portions and the recessed portion and that bonds the display panel to the chassis at the protruding portions.

According to this invention, the bonding of the display panel in the adhesive area and the non-bonding of the liquid crystal display panel in the non-adhesive area can be achieved with ease while using one double-sided tape as the adhesive member.

In the eight invention, the display device according to any one of the first to seventh inventions, wherein widths of the respective select areas in the direction along which the flexible printed circuit boards are arranged are narrower than width widths of respective flexible printed circuit boards in the direction.

According to this invention, even if the frame and the display panel are slightly offset, the adhesive area can be formed on the area overlapping the flexible printed circuit board when bonding the display panel with the frame.

Effects of the Invention

According to the present invention, the concentration of stress near the boundary between an adhesive area and a non-adhesive area of a display panel can be suppressed because a surface of the display device and a frame is bonded in an area that overlaps a flexible printed circuit board while a surface of the display device and a frame is not bonded in a region between flexible printed circuit boards arranged adjacent to each other. Thus, in the display device provided with a plurality of flexible printed circuit boards, the display quality of the display device can be improved by ensuring that the display panel does not deform into a wave-shape, while suppressing the increase in the number of components used.

DETAILED DESCRIPTION OF EMBODIMENTS

Embodiments of the present invention will be described in detail below with reference to drawings. In the present embodiment, a liquid crystal display device will be described as an example of a display device of the present invention. The present invention is not limited to the embodiments below.

<Embodiment 1>

Figure 1:
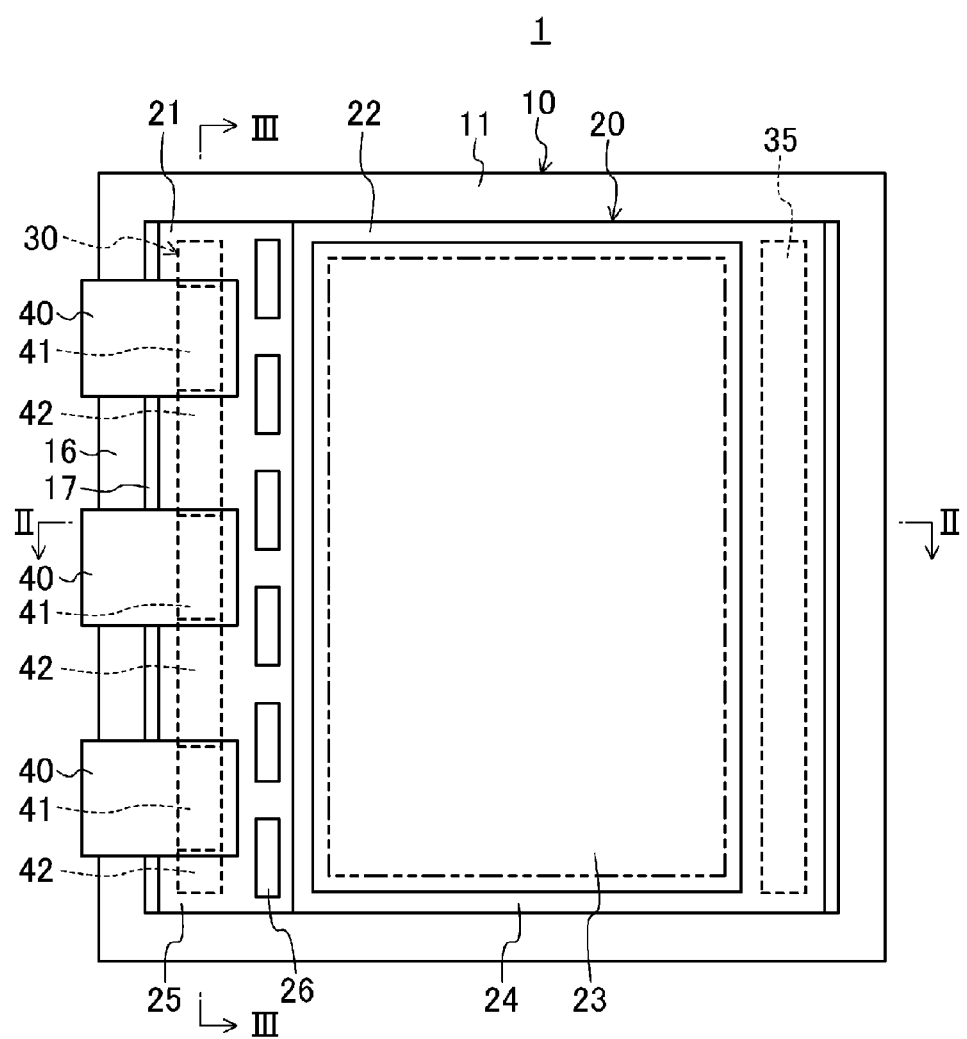
FIG. 1 is a plan view that shows a liquid crystal display device of Embodiment 1.
Figure 2:
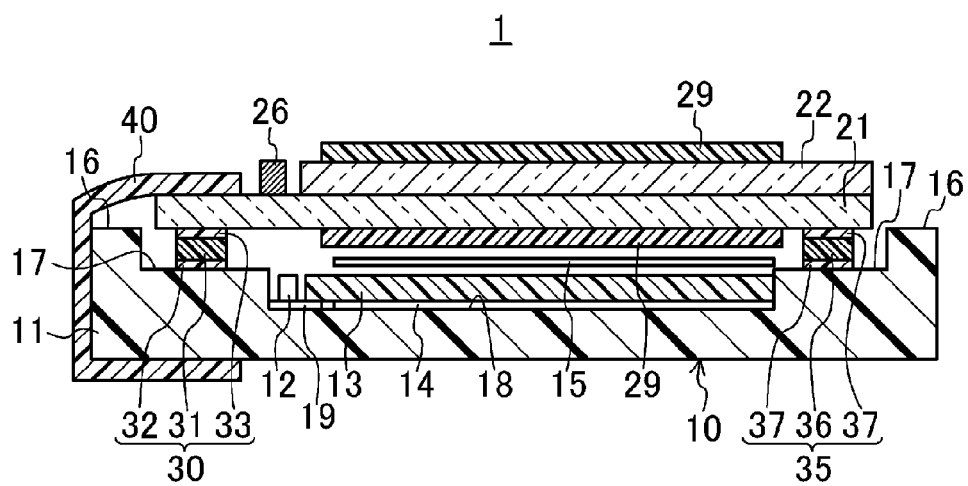
FIG. 2 is a cross-sectional view along the line II-II in FIG. 1.
Figure 3:
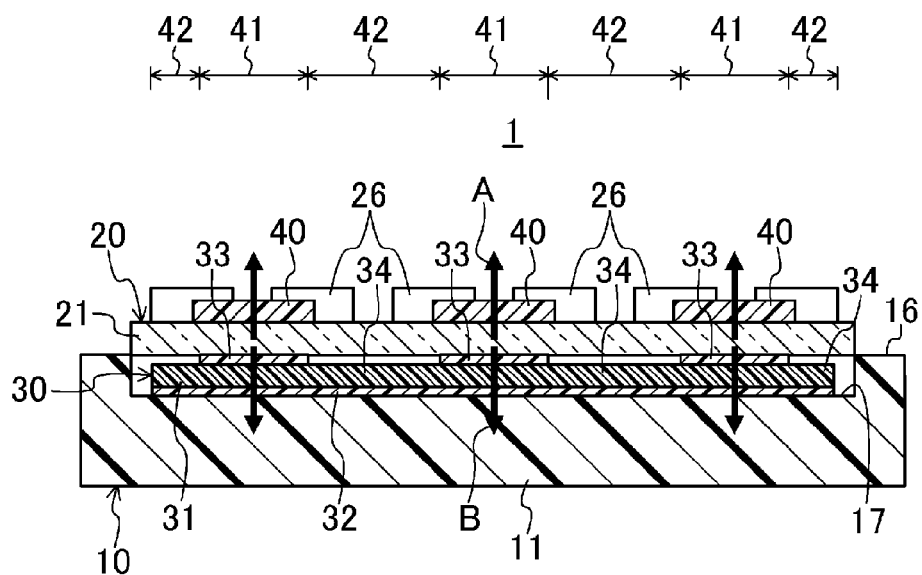
FIG. 3 is a cross-sectional view along the line III-III in FIG. 1.

FIGS. 1 to 3 show Embodiment 1 of the present invention. FIG. 1 is a plan view that shows a liquid crystal display device 1 of Embodiment 1. FIG. 2 is a cross-sectional view along the line II-II in FIG. 1. FIG. 3 is a cross-sectional view along the line III-III in FIG. 1.

As shown in FIG. 1, the liquid crystal display device 1 is provided with a liquid crystal display panel 20 as a display panel and a backlight module 10 as an illumination device that supplies light to the liquid crystal display panel 20.

As shown in FIGS. 1 and 2, the backlight module 10 includes: a frame 11 formed of a plastic material in a substantially rectangular frame shape, light-emitting diodes (hereinafter, LEDs) 12 each disposed within the frame 11 as a light source, a light guide plate 13, a reflective sheet 14, and an optical sheet 15.

The frame 11 is provided with a first step surface 17 formed in the inner side of an outer edge part 16, the first step surface 17 being lower than the outer edge part 16. In the inner side of the first step surface 17, a second step surface 18 is formed even lower than the first step surface 17. In the frame 11, a step surface higher than the first step surface 17 may be formed between the inner side of the outer edge part 16 and the outer side of the first step surface 17, for example.

The second step surface 18 is provided with the reflective sheet 14 and an LED substrate 19. The LED substrate 19 is formed of a flexible substrate. A light guide plate 13 is disposed on the reflective sheet 14. A plurality of the LEDs 12 that are arranged on the LED substrate 19 are disposed on a side face of the light guide plate 13. The optical sheet 15 such as a lens sheet is provided on the light guide plate 13.

A light from the LED 12 entering a side face of the light guide plate 13 is reflected and diffused inside the plate. The light outputted from the light guide plate 13 towards the reflective sheet 14 is reflected by the reflective sheet 14 and is again received by the light guide plate 13. The light outputted from the upper face of the light guide plate 13 passes through the optical sheet 15 and is outputted as an illumination light. In this manner, the backlight module 10 supplies illumination light to the liquid crystal display panel 20.

The liquid crystal display panel 20 is formed in a rectangular plate shape and is fixed to the frame 11 of the backlight module 10. As shown in FIGS. 1 and 2, the liquid crystal display panel 20 has a TFT substrate 21 as the first substrate, and an opposite substrate 22 as the second substrate disposed opposite to the TFT substrate.

A transparent common electrode (not shown), a color filter (not shown) and the like are formed on the opposite substrate 22. A plurality of pixel electrodes (not shown) arranged in a matrix and a plurality of TFTs (thin-film transistors) connected to the pixel electrodes are formed on the TFT substrate 21. Polarizing plates 29 are attached to the TFT substrate 21 on the surface opposite to the surface facing the opposite substrate 22 and the opposite substrate 22 on the surface opposite to the surface facing the TFT substrate 21, respectively.

A liquid crystal layer (not shown) is sealed between the TFT substrate 21 and the opposite substrate 22. Furthermore, as shown in FIG. 1, a display area 23 is formed in the area in which the liquid crystal layer is sealed, and a non-display area 24 is formed in a frame shape surrounding the display area 23. The non-display area 24 is formed along the four peripheral sides of the liquid crystal display panel 20.

Furthermore, in the non-display area 24 of the TFT substrate 21, a terminal region 25 with a plurality of terminals formed therein is provided as an area that is not facing the opposite substrate 22. The terminal region 25 is formed along one side of the liquid crystal display panel 20, and the width of the terminal region in the direction orthogonal to the side is wider than the non-display area 24 formed along other sides.

A plurality of flexible printed circuit boards (hereinafter, FPCs) are provided in the liquid crystal display panel 20, and are arranged adjacent to each other at prescribed intervals. As shown in FIG. 2, the FPC 40 is attached to the terminal region 25 of the liquid crystal display panel 20 in which one end is bonded to the display panel and is bent at a side face of the backlight module 10. Meanwhile, another end of the FPC 40 is bent towards the direction opposite to the liquid crystal display panel 20 of the frame 11, and is bonded to the rear surface of the backlight module 10 using a double-sided tape and the like. Furthermore, in the terminal region 25, a plurality of driver ICs 26 are provided between the FPC 40 and the display area 23.

Also, as shown in FIG. 2, the liquid crystal display panel 20 is bonded to the frame 11 at the terminal region 25 by the adhesive member 30, and is also bonded to the non-display area 24 formed opposite to the terminal region 25 of the display area 23 by the double-sided adhesive tape 35. The adhesive member 30 and a double-sided adhesive tape 35 are respectively placed between the liquid crystal display panel 20 and the first step surface 17 of the frame 11.

Also, the liquid crystal display device 1 as shown in FIG. 1 has an adhesive area 41 where the surface of the liquid crystal display panel 20 is bonded to the frame 11 in the area thereof that overlaps the FPC 40. Furthermore, a non-adhesive area 42, in which the surface of the liquid crystal display panel 20 is not bonded to the frame 11, is provided in the area between the plurality of FPCs 40 arranged adjacent to each other. In the present embodiment, the adhesive areas 41 are the areas between the non-adhesive areas 42 arranged adjacent to each other. Furthermore, the width of the adhesive area 41 in the direction in which the plurality of FPCs 40 are arranged (in other words, in the up-and-down direction in FIG. 1) is narrower than the width of the FPCs 40 in the above-mentioned direction in which the FPCs 40 are arranged.

As shown in FIG. 3, the adhesive member 30 includes: a film-shaped base material 31 that extends along a side of the liquid crystal display panel 20 where the aforementioned adhesive member 30 is provided, the first adhesive part 32 that is provided on an entire surface of the base material 31 in the side thereof facing the first step surface 17; the second adhesive part 33 provided on a surface of the base material 31 facing the liquid crystal display panel 20 in the adhesive area 41; and the non-adhesive part 34 provided on a surface of the base material 31 facing the liquid crystal display panel 20 in the non-adhesive area 42.

In the present embodiment, a non-adhesive part 34 is formed by exposing the base material 31 by not providing the second adhesive part 33 in the non-adhesive area 42. In other words, the non-adhesive part 34 is provided between the second adhesive parts 33 arranged adjacent to each other.

The double-sided adhesive tape 35 extends along a side of the liquid crystal display panel 20 in a belt-shape in which the aforementioned double-sided adhesive tape 35 is provided, and has a film-shaped base material 36 and adhesive layers 37 provided on an entire surface of the top face and the bottom face of the base material 36.

Base materials 31 and 36 are formed of plastic films and the like, for example, and the first adhesive part 32, the second adhesive part 33, and the adhesive layer 37 are formed of acrylic-based adhesives and silicone-based adhesives, for example.

The second adhesive part 33 and the non-adhesive part 34 of the adhesive member 30 can be formed by coating the base material 31 with adhesives through a mask with an opening arranged in the area to become the adhesive area 41.

-Effects of Embodiment 1-

Figure 4:
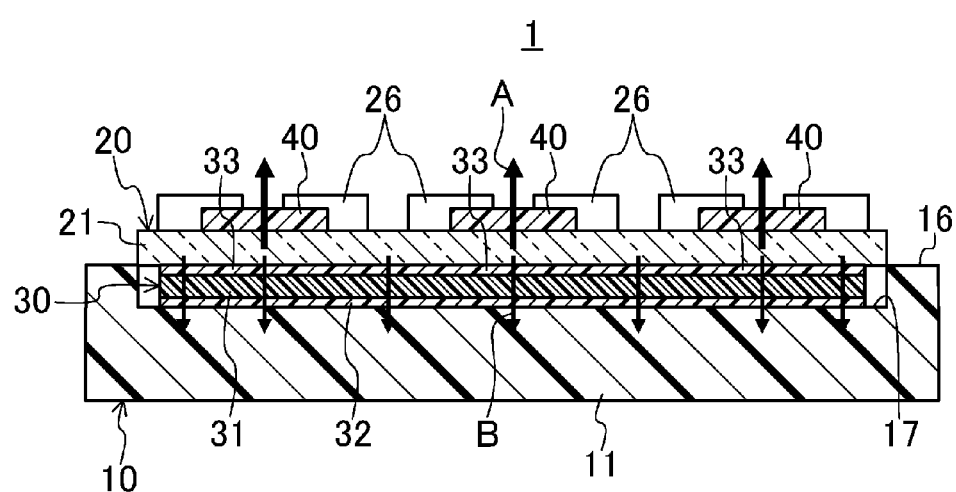
FIG. 4 is a comparison example that corresponds to the liquid crystal display device shown in FIG. 3.

FIG. 4 is a comparison example of a liquid crystal display device that corresponds to FIG. 3. The liquid crystal display device used as a comparison example does not have the non-adhesive area 42. In other words, the adhesive member 30 of the comparison example is provided with the second adhesive part 33 on the entire surface of the substrate 31 facing the liquid crystal display panel 20, and does not have the non-adhesive part 34.

An upward (in other words, the direction in which the liquid crystal display panel 20 rises from the frame 11) stress A in FIG. 4 due to the restoring force of the FPC 40 and a downward stress B due to the adhesive strength of the second adhesive part 33 affect the liquid crystal display panel 20 of the comparison example in the area thereof where the FPC 40 overlaps. Meanwhile, the area between the FPCs 40 adjacent to each other is only affected by the stress B due to the adhesive strength of the second adhesive part 33. Due to this, a concentration of stress occurs near the boundary between the area where the FPCs 40 overlap and the area between the FPCs 40 adjacent to each other. As a result, the liquid crystal display panel 20 may deform into a wave shape near the terminal region 25, resulting in uneven display.

By contrast, according to Embodiment 1, since the surface of the liquid crystal display panel 20 and the frame 11 are bonded in the adhesive area 41 that overlaps with the FPCs 40, and the surface of the liquid crystal display panel 20 and the frame 11 are not bonded in the non-adhesive area 42 between the FPCs 40 adjacent to each other, while both the upward stress A and the downward stress B in FIG. 3 affect the liquid crystal display panel 20 in the adhesive area 41, neither the stress A nor the stress B affect the non-adhesive area 42. Therefore, a concentration of stress near the boundary between the adhesive area 41 and the non-adhesive area 42 of the liquid crystal display panel 20 can be suppressed for the liquid crystal display device 1 of the present Embodiment 1. Thus, in the liquid crystal display device 1 provided with the plurality of FPCs 40, the display quality of the liquid crystal display device 1 can be improved by ensuring that the liquid crystal display panel 20 does not deform into a wave shape while also suppressing an increase in the number of components.

Moreover, because the adhesive member 30 is provided across the adhesive area 41 and the non-adhesive area 42, foreign matter is prevented from entering the area between the liquid crystal display panel 20 and the frame 11, resulting in a more reliable liquid crystal display device 1. Furthermore, by providing one adhesive member 30 for the plurality of adhesive areas 41, the manufacturing procedure is simplified compared to a case in which individual adhesive members 30 are provided in each adhesive area 41.

Furthermore, when bonding the liquid crystal display panel 20 to the frame 11, even if the frame 11 and the liquid crystal display panel 20 are slightly offset, the adhesive area 41 can be formed in the area overlapping the FPC 40.

<Embodiment 2>

Figure 5:
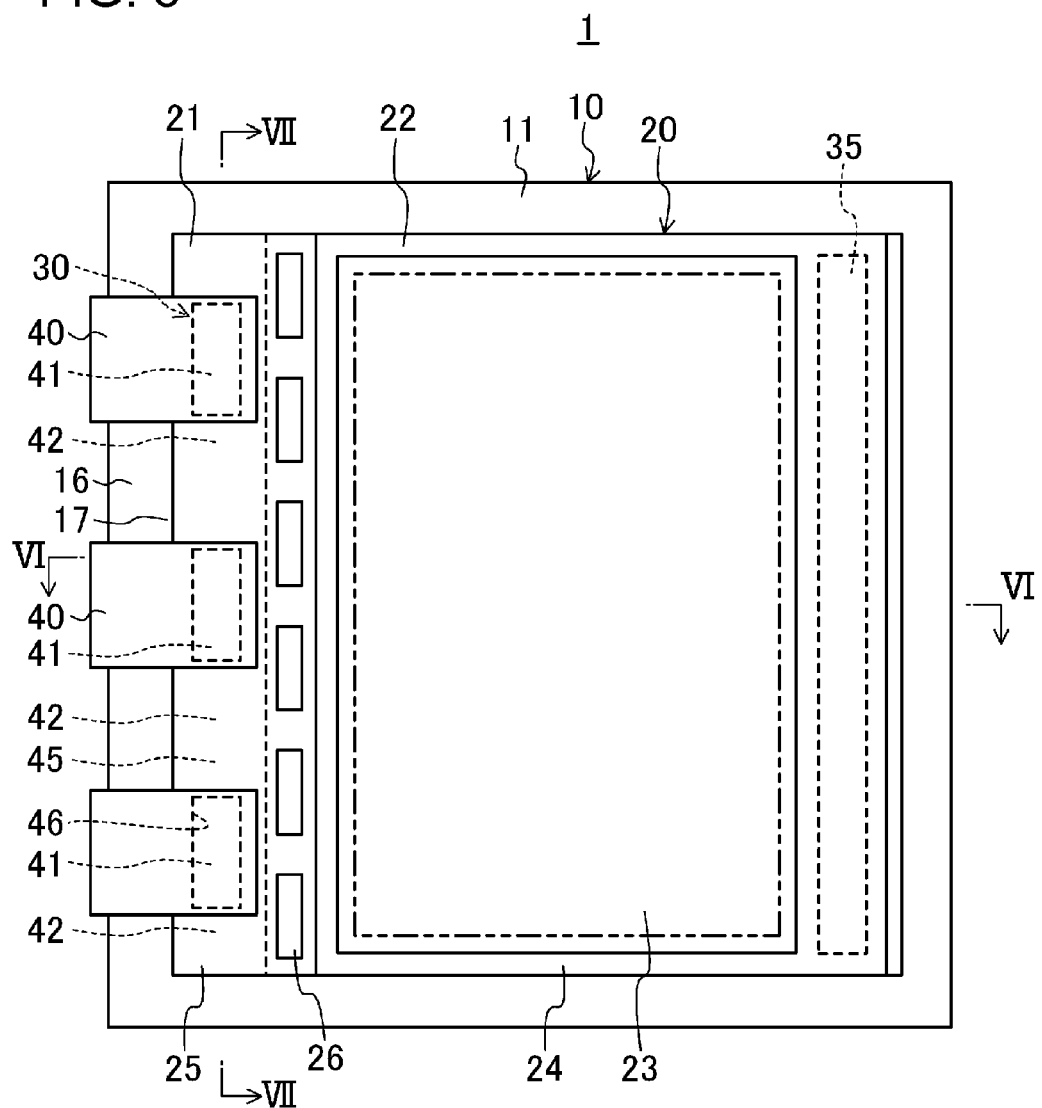
FIG. 5 is a plan view that shows a liquid crystal display device 1 of Embodiment 2.
Figure 6:
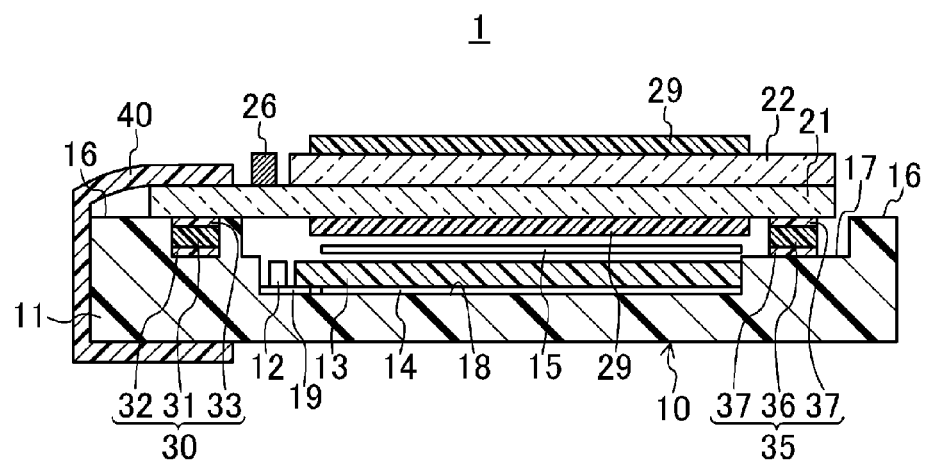
FIG. 6 is a cross-sectional view along the line VI-VI in FIG. 5.
Figure 7:
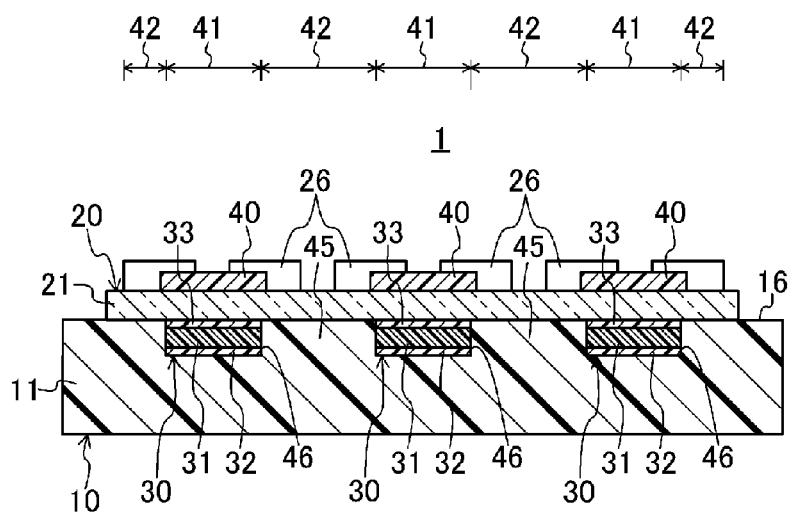
FIG. 7 is a cross-sectional view along the line VII-VII in FIG. 5.

FIGS. 5 to 7 show Embodiment 2 of the present invention.

FIG. 5 is a plan view that shows a liquid crystal display device 1 of Embodiment 2.

FIG. 6 is a cross-sectional view along the line VI-VI in FIG. 5. FIG. 7 is a cross-sectional view along the line VII-VII in FIG. 5. In each embodiment below, parts that are the same as FIGS. 1 to 4 are assigned the same reference characters and detailed descriptions thereof will be omitted.

The liquid crystal display device 1 of the above-mentioned Embodiment 1 has one adhesive member 30, but the liquid crystal display device 1 of the Embodiment 2 is different in that it has a plurality of adhesive members 30, and none of the adhesive members 30 have a non-adhesive part 34.

As shown in FIGS. 5 and 7, between the frame 11 and the liquid crystal display panel 20, island-shaped adhesive members 30 are provided in the adhesive areas 41. In other words, adhesive members 30 are provided respectively in the adhesive areas 41. As shown in FIG. 7, the adhesive member 30 is formed of a double-sided tape and includes: a base material 31 in a film shape, a first adhesive part 32 provided on the entire surface of the base material 31 on the opposite side from the side facing the liquid crystal display panel 20, and a second adhesive part 33 that is provided on the entire surface of the liquid crystal display panel 20 in the base material 31.

Furthermore, in the liquid crystal display device 1, a shielding part 45 that covers the gaps between the adhesive members 30 is formed between the frame 11 and the liquid crystal display panel 20. In other words, the shielding parts 45 are provided in the respective non-adhesive areas 42.

In Embodiment 2, the shielding part 45 is formed of a portion of the frame 11. In other words, as shown in FIGS. 5 to 7, frame 11 has a plurality of recessed portions 46 formed in the adhesive area 41. The shielding portions 45 formed of the frame 11 surrounding the recessed portion 46 are disposed in the non-adhesive area 42. The surface of the shielding part 45 is disposed near the bottom face of the liquid crystal display panel 20.

Furthermore, each recess portion 46 houses the aforementioned adhesive member 30. Furthermore, while the first adhesive part 32 of the adhesive member 30 is bonded to the frame 11 at the bottom face of the recess portion 46, the second adhesive part 33 of the adhesive member 30 is bonded to the bottom of the liquid crystal display panel 20.

-Effects of Embodiment 2-

Therefore, in Embodiment 2 also, while the liquid crystal display panel 20 and the frame 11 are bonded in the adhesive area 41 by the adhesive member 30, because no adhesive member 30 is provided in the non-adhesive area 42, the liquid crystal display panel 20 and the frame 11 are not necessarily bonded to each other. Thus, the concentration of stress near the boundary between the adhesive area 41 and the non-adhesive area 42 of the liquid crystal display panel 20 can be suppressed, and the display quality of the liquid crystal display device 1 can be improved by ensuring that the liquid crystal display panel 20 does not deform into a wave-shape.

Furthermore, since the gaps between the adhesive members 30 adjacent to each other are covered by the shielding part 45, it is harder for foreign matter to enter between the liquid crystal display device 20 and the frame 11 from outside, resulting in a more reliable liquid crystal display device 1. Moreover, since the shielding part 45 can be made of the frame 11, which is a material used to form the backlight module 10, the increase in the number of components from forming a shielding part 45 can also be suppressed.

<Embodiment 3>

Figure 8:
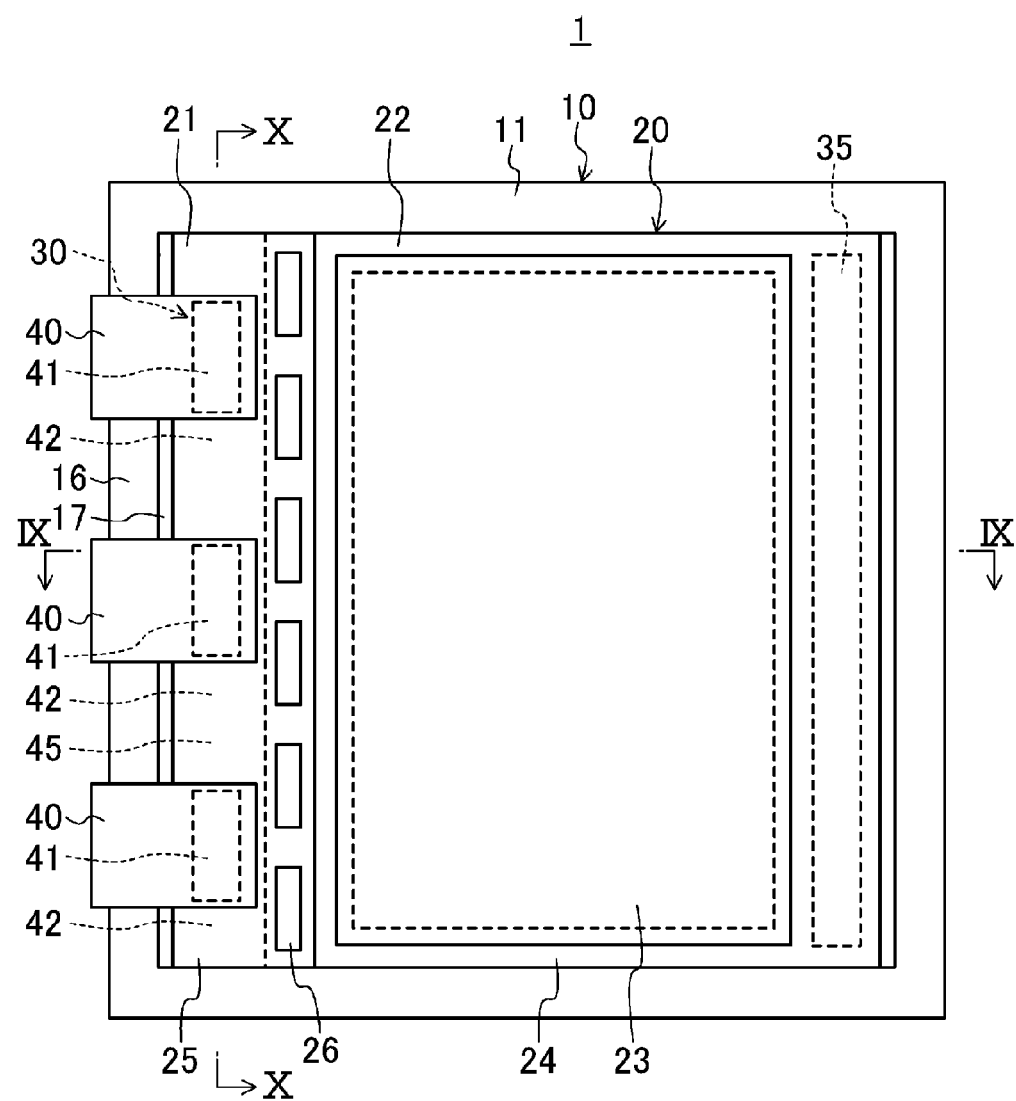
FIG. 8 is a plan view that shows a liquid crystal display device 1 of Embodiment 3.
Figure 9:
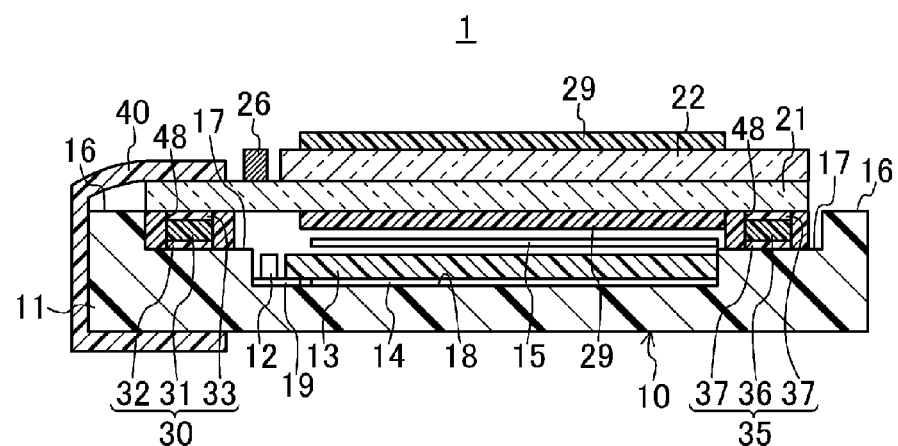
FIG. 9 is a cross-sectional view along the line IX-IX in FIG. 8.
Figure 10:
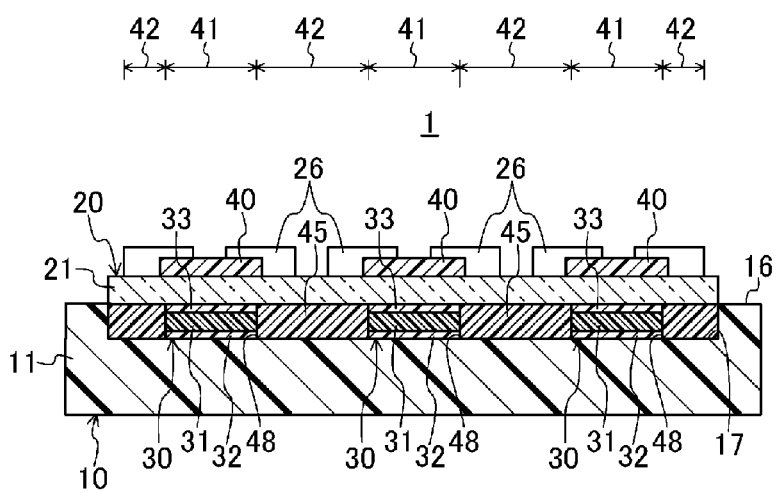
FIG. 10 is a cross-sectional view along the line X-X in FIG. 8.

FIGS. 8 to 10 show Embodiment 3 of the present invention.

FIG. 8 is a plan view that shows a liquid crystal display device 1 of Embodiment 3. FIG. 9 is a cross-sectional view along the line IX-IX in FIG. 8. FIG. 10 is a cross-sectional view along the line X-X in FIG. 8.

The liquid crystal display device 1 of the above mentioned Embodiment 1 has one adhesive member 30, but the liquid crystal display device 1 of the present Embodiment 2 is different in that it does not have a plurality of adhesive members 30. Furthermore, while the shielding part 45 is formed of a portion of the frame 11 in the Embodiment 2, the present Embodiment 3 is different in that the shielding part 45 is formed of another member.

As shown in FIGS. 8 and 10, an adhesive member 30 is provided in an island-shape in the adhesive area 41 between the frame 11 and the liquid crystal display panel 20. In other words, adhesive members 30 are provided on each adhesive area 41 respectively. As shown in FIG. 10, the adhesive member 30 is formed of a double-sided tape and includes: a film-shaped base material 31, a first adhesive part 32 provided on an entire surface of the base material 31 opposite to the liquid crystal display panel 20, and a second adhesive part 33 provided on an entire surface of the base material 31 facing the liquid crystal display panel 20.

A shielding part 45 is provided on the liquid crystal display device 1 that covers the gaps between the adhesive members 30 formed between the frame 11 and the liquid crystal display panel 20. In other words, the shielding parts 45 are provided in each non-adhesive area 42 respectively.

The shielding part 45 of Embodiment 3 is formed of a spacer 45 that is formed independently of the frame 11. For example, the spacer 45 can be formed of a sponge, a rubber material, and the like. Furthermore, the spacer 45 is provided with a plurality of openings 48 formed in the adhesive area 41 and also provided on a first step surface 17 of the frame 11. Also, a surface of the spacer 45 is in contact with the bottom face of the liquid crystal display panel 20.

Each opening 48 is provided with an adhesive member 30. In this manner, while the adhesive members 30 are disposed in the adhesive areas 41, the non-adhesive area 42 is provided with a shielding part 45 formed of a spacer 45. In each adhesive area 41, while the first adhesive part 32 of the adhesive member 30 is attached to the frame 11, the second adhesive part 33 of the adhesive member 30 is attached to the bottom face of the liquid crystal display panel 20.

-Effects of Embodiment 3-

Therefore, also for this Embodiment 3, while the liquid crystal display panel 20 and the frame 11 are bonded in the adhesive area 41 by the adhesive member 30, since no adhesive member 30 is provided in the non-adhesive area 42, the liquid crystal display panel 20 and the frame 11 are not necessarily bonded. Thus, the concentration of stress near the boundary between the adhesive area 41 and the non-adhesive area 42 of the liquid crystal display panel 20 can be suppressed, and the display quality of the liquid crystal display device 1 can be improved such that the liquid crystal display panel 20 is not deformed into a wave-shape.

Furthermore, because the gaps between the adhesive members 30 adjacent to each other are covered by the shielding part 45, it is more difficult for foreign matter to enter an area between the liquid crystal display panel 20 and the frame 11, which results in a more reliable liquid crystal display device 1. Furthermore, because the shielding part 45 is formed of the spacer 45 that is formed separately from the frame 11, the spacer 45 can be formed of other suitable materials (such as sponge and rubber, for example) that are different from the materials used for the frame 11, the adhesive member 30, and the like.

<Embodiment 4>

Figure 11:
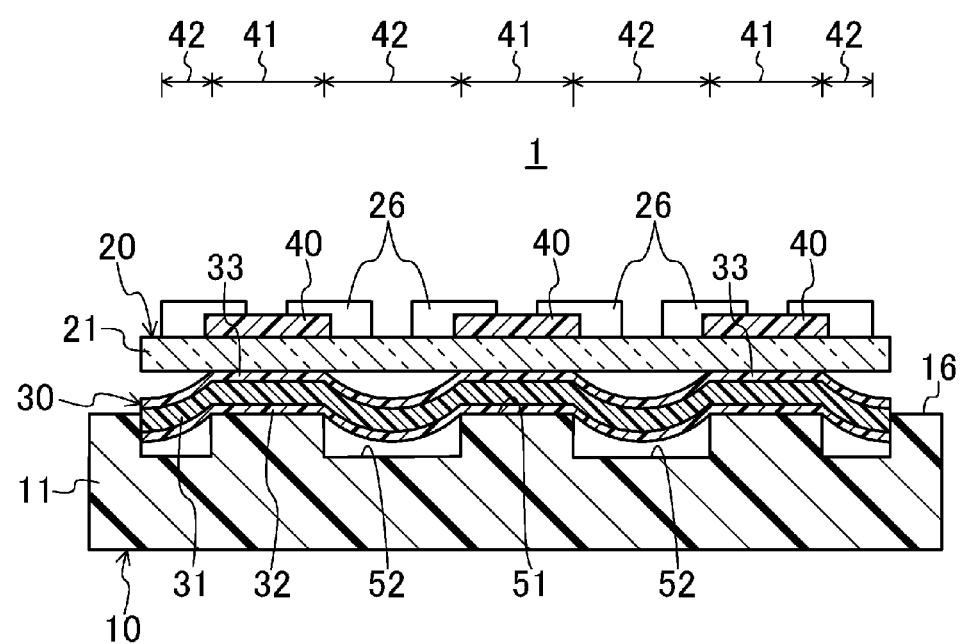
FIG. 11 is a cross-sectional view showing a liquid crystal display device 1 according to Embodiment 4.

FIG. 11 shows Embodiment 4 of the present invention. FIG. 11 is a cross-sectional view that shows a liquid crystal display device 1 of Embodiment 4.

While an adhesive member 30 that has a second adhesive part 33 and a non-adhesive part 34 was provided on a flat first step surface 17 of a frame 11 in Embodiment 1, Embodiment 4 is provided with adhesive members 30 that do not have a non-adhesive part 34 on the recessed and protruding portions of a frame 11.

As shown in FIG. 11, in the adhesive area 41, the frame 11 has protruding portions 51 on a side facing a liquid crystal display panel 20 and a recessed portion 52 formed between the protruding portions 51. In other words, the recessed portion 52 is formed in a non-adhesive area 42.

Furthermore, an adhesive member 30 that covers the protruding portions 51 and the recessed portion 52 of the frame 11 and bonds a surface of the liquid crystal display panel 20 to the frame 11 at the protruding portions 51 is provided between the liquid crystal display panel 20 and the frame 11. The adhesive member 30 is formed of a double-sided tape and includes: a film-shaped base material 31, a first adhesive part 32 provided on an entire surface of a base material 31 opposite to the liquid crystal display panel 20, and a second adhesive part 33 provided on an entire surface of the base material 31 facing the liquid crystal display panel 20.

In an adhesive area 41, while the first adhesive part 32 of the adhesive member 30 is attached to the frame 11, the second adhesive part 33 is attached to the bottom face of the liquid crystal display panel 20. Meanwhile, in the non-adhesive area 42, the first and second adhesive parts 32 and 33 are not bonded to the frame 11 and the liquid crystal display panel 20, respectively.

Also, in the non-adhesive area 42, only one of the first and second adhesive parts 32 and 33 may be bonded to the frame 11 or the liquid crystal display panel 20.

-Effects of Embodiment 4-

Therefore, in Embodiment 4 also, the liquid crystal display panel 20 and the frame 11 can be bonded by the adhesive member 30 in the adhesive area 41, while the liquid crystal display panel 20 and the frame 11 are not bonded in the non-adhesive area 42. Thus, the concentration of stress near the boundary between the adhesive area 41 and the non-adhesive area 42 of the liquid crystal display panel 20 can be suppressed, and the display quality of the liquid crystal display device 1 can be improved by ensuring that the liquid crystal display panel 20 does not deform into a wave-shape.

Moreover, the bonding of the liquid crystal display panel 20 in the adhesive area 41 and the non-bonding of the liquid crystal display panel 20 in the non-adhesive area 42 can be achieved with ease while using one double-sided tape as the adhesive member 30.

<Embodiment 5>

Figure 12:
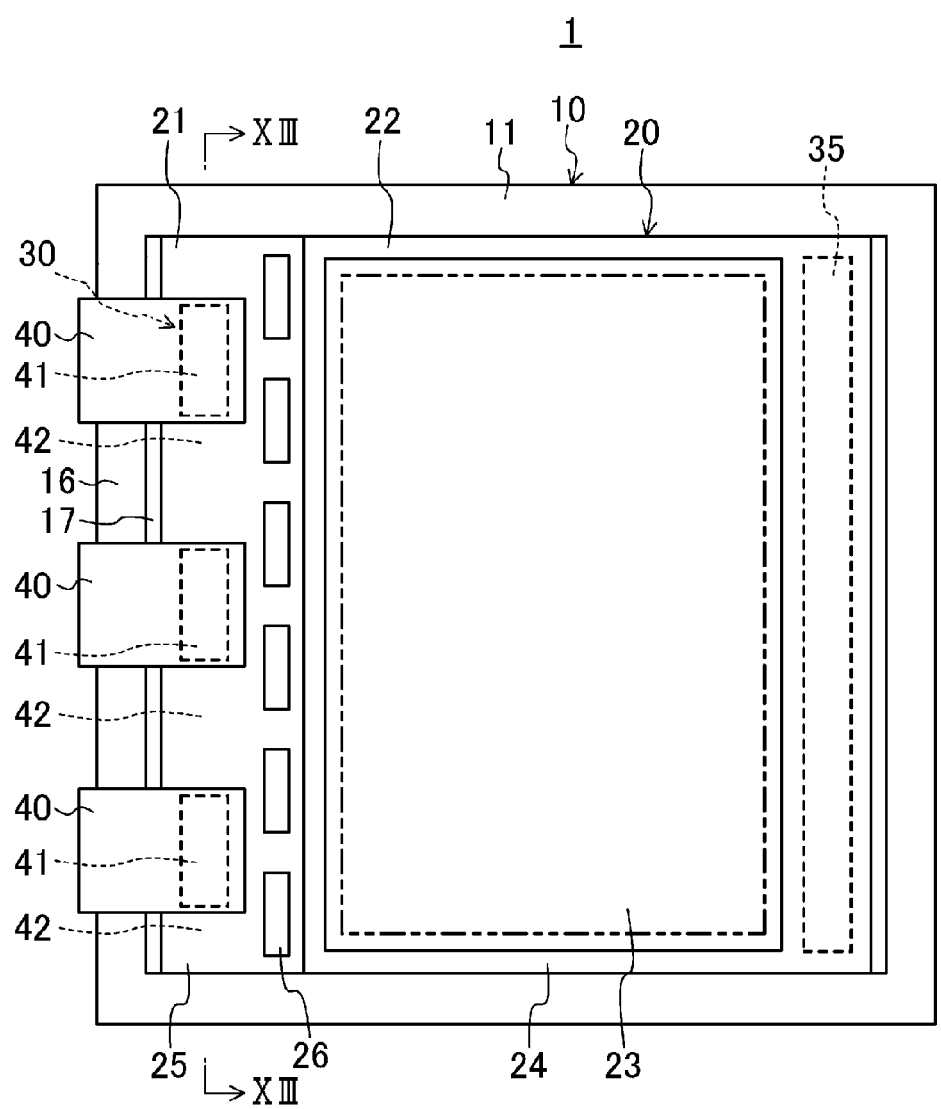
FIG. 12 is a plan view showing a liquid crystal display device 1 according to Embodiment 5.
Figure 13:
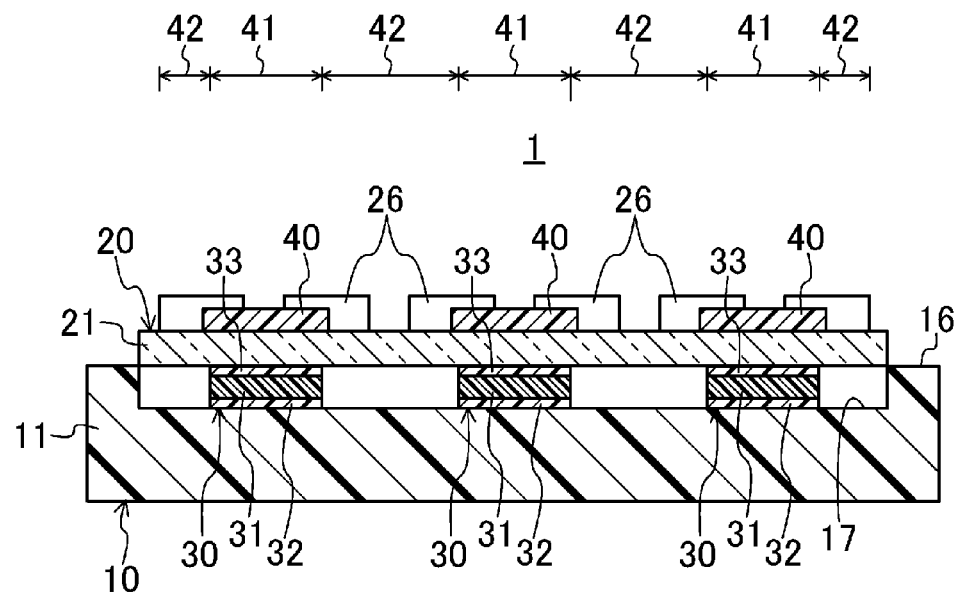
FIG. 13 is a cross-sectional view along the line XIII-XIII in FIG. 12.

FIGS. 12 and 13 show Embodiment 5 of the present invention.

FIG. 12 is a plan view that shows a liquid crystal display device 1 of Embodiment 5. FIG. 13 is a cross-sectional view along the line XIII-XIII in FIG. 12.

Embodiment 5 does not have a shielding part 45 unlike Embodiments 2 and 3, which were provided with a shielding part 45 in the non-adhesive area 42.

Therefore, as shown in FIGS. 12 and 13, island-shaped adhesive members 30 are provided in the adhesive area 41 between the frame 11 and the liquid crystal display panel 20. In other words, adhesive members 30 are provided in each adhesive area 41, respectively. As shown in FIG. 13, the adhesive member 30 is formed of a double-sided tape and includes: a film-shaped base material 31, a first adhesive part 32 provided on an entire surface of the base material 31 opposite to the liquid crystal display panel 20, and a second adhesive part 33 provided on an entire surface of the base material 31 facing the liquid crystal display panel 20.

Meanwhile, a gap is provided between the first step surface 17 of the frame 11 and a bottom face of the liquid crystal display panel 20 in the non-adhesive area 42. Due to this, the liquid crystal display panel 20 is not bonded to the frame 11 in the non-adhesive area 42.

-Effects of Embodiment 5-

Therefore, in Embodiment 5 also, the liquid crystal display panel 20 and the frame 11 can be bonded by the adhesive member 30 in the adhesive area 41, while the liquid crystal display panel 20 and the frame 11 are not bonded in the non-adhesive area 42, and thus the concentration of stress near the boundary between the adhesive area 41 and the non-adhesive area 42 of the liquid crystal display panel 20 can be suppressed. Therefore, the display quality of the liquid crystal display device 1 can be improved while ensuring that the liquid crystal display panel 20 does not deform into a wave-shape.

In addition, a shielding part 45 is not provided, which simplifies the structure of the device and reduces the manufacturing cost.

<Other Embodiments>

Figure 14:
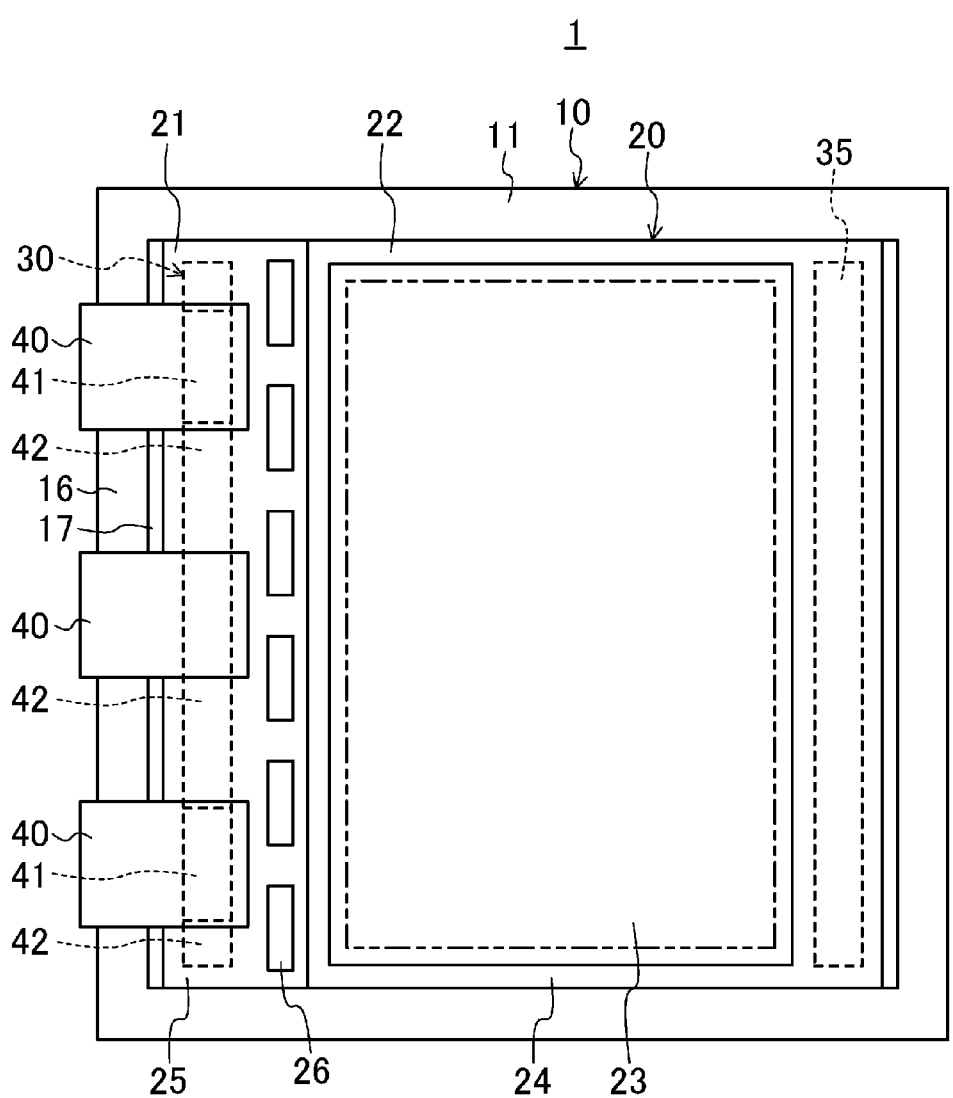
FIG. 14 is a drawing corresponding to FIG. 1 showing another embodiment.
Figure 15:
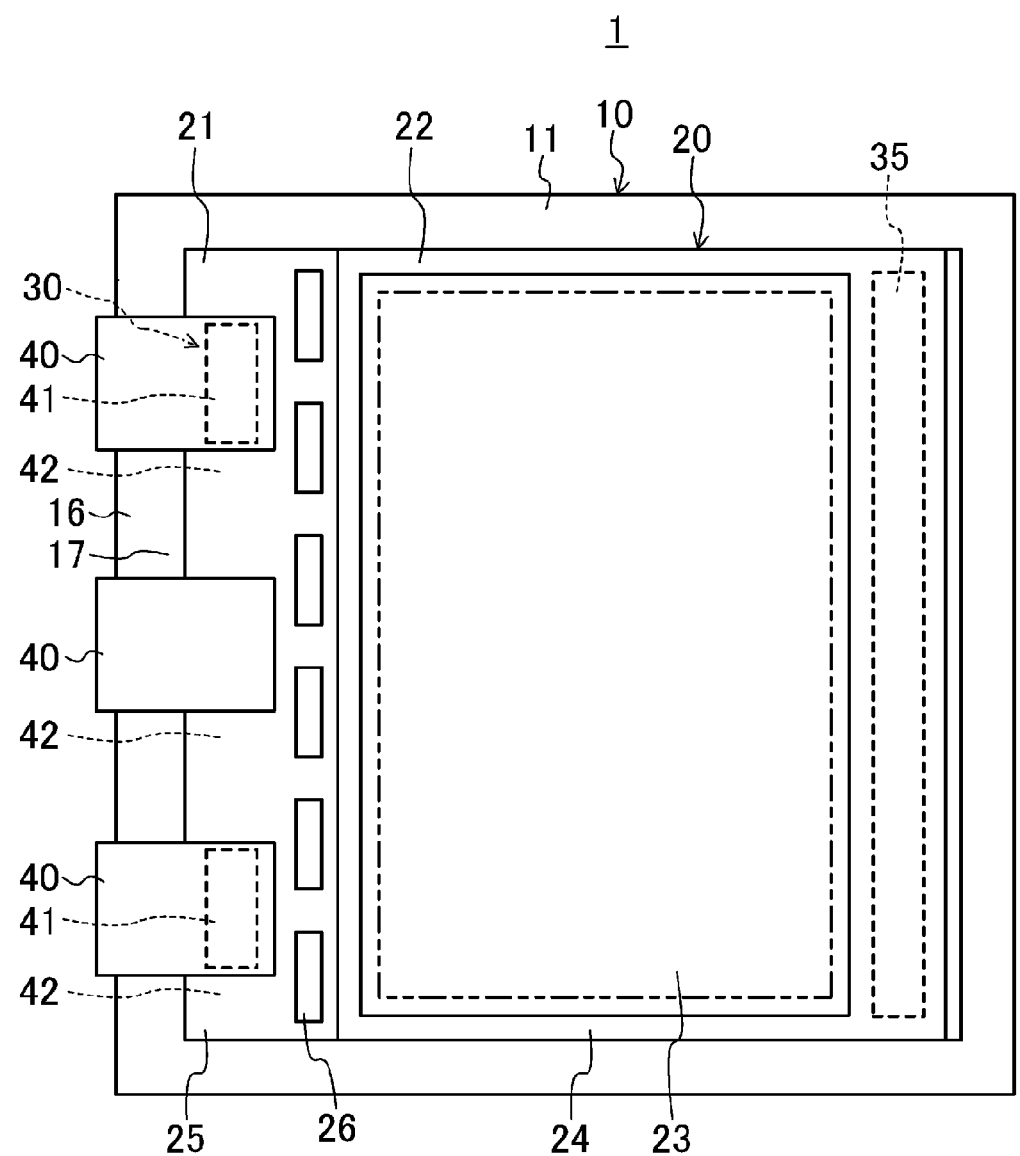
FIG. 15 is a drawing corresponding to FIG. 5 showing another embodiment.

In the above-mentioned embodiments, examples of providing an adhesive area 41 for all areas that overlap with a plurality of FPCs 40 were mentioned, but the present invention is not limited to these examples; as shown in FIG. 14, which corresponds to FIG. 1, and FIG. 15, which corresponds to FIG. 5, for example, one area where each of the plurality of FPCs 40 overlaps can be a non-adhesive area 42 without an adhesive area 41. In this case, it is preferable that the adhesive areas 41 are provided in the areas where FPCs on the top and bottom ends are located in FIGS. 14 and 15, so that enough fixing strength between the liquid crystal display panel 20 and the frame 11 can be obtained.

Figure 16:
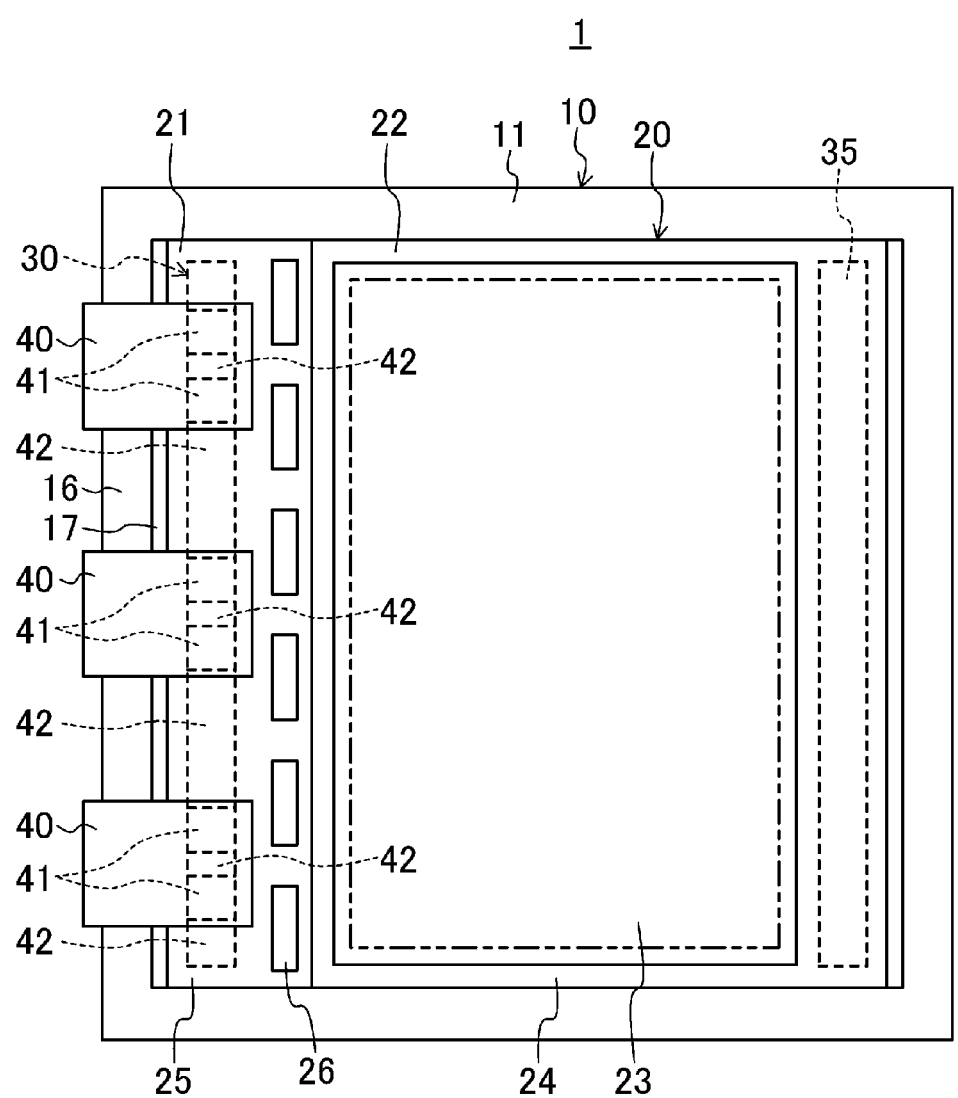
FIG. 16 is a drawing corresponding to FIG. 1 showing another embodiment.

Furthermore, for each of the embodiments above, it has been explained that an adhesive area 41 is provided in an area that overlaps the FPC 40, but the present invention may also be provided with a plurality of adhesive areas 41 in the area that overlaps the FPC 40 as shown in FIG. 16, which corresponds to FIG. 1.

Figure 17:
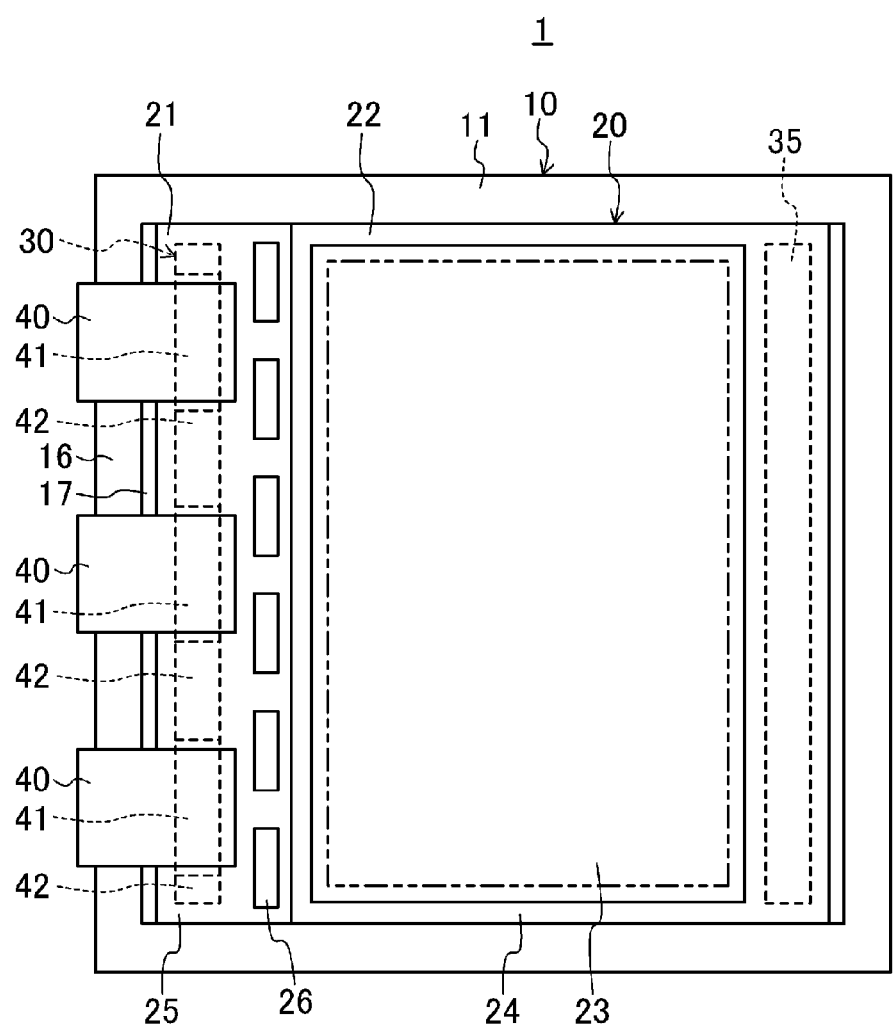
FIG. 17 is a drawing corresponding to FIG. 1 showing another embodiment.

Furthermore, explanations of an example in which the width of an adhesive area 41 is narrower than the width of the FPC 40 were given for the respective embodiments above, but the present invention may also have an adhesive area 41 that protrudes beyond the edge of the FPC 40 as shown in FIG. 17, which corresponds to FIG. 1. Even with this configuration, the deformation of the liquid crystal display panel 20 into a wave-shape can be suppressed. However, in order to more suitably suppress the deformation of the liquid crystal display panel 20, it is preferable that the adhesive area 41 not protrude beyond the edge of the FPC 40 as in the respective embodiments above.

Furthermore, an explanation of an example of a liquid crystal display device 1 as a display device related to the present invention was provided for the respective embodiments above, but the present invention may also be applied to other display devices such as organic EL display devices and plasma display devices in the same manner.

For example, the present invention can also be used for an organic EL display panel with a plurality of FPCs attached, and also for an organic EL display device with a frame that is fixed to the organic EL display panel.

INDUSTRIAL APPLICABILITY

As explained above, the present invention is useful for a display device that has a flexible printed circuit board.

DESCRIPTION OF REFERENCE CHARACTERS

1 liquid crystal display device
10 backlight module
11 frame
20 liquid crystal display panel
30 adhesive member
33 second adhesive part (adhesive part)
34 non-adhesive part
40 FPC (flexible printed circuit board)
41 adhesive area
42 non-adhesive area
45 shielding part, spacer
51 protruding portion
52 recessed portion

The invention claimed is:

1. A display device, comprising:
a chassis;
a display panel fixed to a front of the chassis; and
a plurality of flexible printed circuit boards that are arranged adjacent to each other with a gap therebetween along a side of the chassis, one end of each flexible printed circuit board being attached to the display panel, each flexible printed circuit board being bent such that another end of the flexible printed circuit board is on a rear of the chassis,
wherein the display panel is bonded to the chassis in select areas, which correspond to overlaps between the respective flexible printed circuit boards and the display panel in a plan view, and
wherein the display panel is not physically bonded to the chassis in an area other than the select areas along said side of the chassis, where the flexible printed circuit board does not overlap the display in the plan view.

2. The display device according to claim 1,
wherein the display panel and the chassis are bonded by interposing an adhesive member between the chassis and the display panel, the adhesive member having an adhesive portion on a front surface of said adhesive member facing the display panel in said select areas, and having a non-adhesive portion on a front surface of said adhesive member facing the display panel in the area other than the select area along said side of the chassis with the flexible printed circuit boards.

3. The display device according to claim 2,
wherein widths of the respective select areas in the direction along which the flexible printed circuit boards are arranged are narrower than widths of respective flexible printed circuit boards in said direction.

4. The display device according to claim 1,
wherein the display panel and the chassis are bonded by interposing a plurality of island-shaped adhesive members between the chassis and the display panel, the adhesive members being provided in said select areas, each of the adhesive members having an adhesive portion formed on an entire front surface of each adhesive member facing the display panel.

5. The display device according to claim 4, further comprising:
a shielding part that covers a gap between the adhesive members formed between the chassis and the display panel.

6. The display device according to claim 5,
wherein the shielding part is a spacer formed separately from the chassis.

7. The display device according to claim 5,
wherein widths of the respective select areas in the direction along which the flexible printed circuit boards are arranged are narrower than widths of respective flexible printed circuit boards in said direction.

8. The display device according to claim 4, wherein the chassis has a shielding part that fills an entire area between the adhesive members.

9. The display device according to claim 8,
wherein widths of the respective select areas in the direction along which the flexible printed circuit boards are arranged are narrower than widths of respective flexible printed circuit boards in said direction.

10. The display device according to claim 4,
wherein widths of the respective select areas in the direction along which the flexible printed circuit boards are arranged are narrower than widths of respective flexible printed circuit boards in said direction.

11. The display device according to claim 1,
wherein the chassis includes protruding portions protruding towards the display panel in the select areas, and a recessed portion formed between the protruding portions, and
wherein the display device further comprises an adhesive member that covers the protruding portions and the recessed portion and that bonds the display panel to the chassis at the protruding portions.

12. The display device according to claim 11,
wherein widths of the respective select areas in the direction along which the flexible printed circuit boards are arranged are narrower than widths of respective flexible printed circuit boards in said direction.

13. The display device according to claim 1,
wherein widths of the respective select areas in the direction along which the flexible printed circuit boards are arranged are narrower than widths of respective flexible printed circuit boards in said direction.

* * * * *